(12) United States Patent
Suzuki et al.

(10) Patent No.: US 11,385,455 B2
(45) Date of Patent: Jul. 12, 2022

(54) OPTICAL MODULE AND METHOD FOR MANUFACTURING OPTICAL MODULE

(71) Applicant: HAMAMATSU PHOTONICS K.K., Hamamatsu (JP)

(72) Inventors: Daiki Suzuki, Hamamatsu (JP); Shinya Iwashina, Hamamatsu (JP); Yuki Morinaga, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 333 days.

(21) Appl. No.: 16/636,413

(22) PCT Filed: Aug. 6, 2018

(86) PCT No.: PCT/JP2018/029370
§ 371 (c)(1),
(2) Date: Feb. 4, 2020

(87) PCT Pub. No.: WO2019/031437
PCT Pub. Date: Feb. 14, 2019

(65) Prior Publication Data
US 2020/0174247 A1    Jun. 4, 2020

(30) Foreign Application Priority Data

Aug. 10, 2017  (JP) .............................. JP2017-156010

(51) Int. Cl.
*G02B 26/08* (2006.01)
*B81B 3/00* (2006.01)
(Continued)

(52) U.S. Cl.
CPC .......... *G02B 26/085* (2013.01); *B81B 3/0051* (2013.01); *B81C 3/00* (2013.01);
(Continued)

(58) Field of Classification Search
CPC .... G02B 26/085; G02B 7/198; G02B 26/101; G02B 26/10; B81B 3/0051; B81B 2201/04; B81B 3/00; H01F 7/0221
(Continued)

(56) References Cited

U.S. PATENT DOCUMENTS 9,664,897 B1* 5/2017 Hirshberg ............ G02B 26/085
2005/0099671 A1 5/2005 Matsuo et al.
(Continued)

FOREIGN PATENT DOCUMENTS

CN    101527493 A    9/2009
CN    202405988 U    8/2012
(Continued)

OTHER PUBLICATIONS

International Preliminary Report on Patentability dated Feb. 20, 2020 for PCT/JP2018/029370.
(Continued)

*Primary Examiner* — Euncha P Cherry
(74) *Attorney, Agent, or Firm* — Faegre Drinker Biddle & Reath LLP

(57) ABSTRACT

An optical module includes a mirror unit having a movable mirror portion, a magnet portion configured to generate a magnetic field acting on the movable mirror portion, and a package accommodating the magnet portion. The magnet portion has a Halbach structure including a first magnet applied with a force in a first direction, and a second magnet applied with a force in a second direction. The package has a bottom walls portion, a side wall portion, and a restriction portion configured to restrict movement of the second magnet in the second direction. The movable mirror portion is disposed in a space formed by the restriction portion.

9 Claims, 9 Drawing Sheets

(51) Int. Cl.
  *B81C 3/00* (2006.01)
  *G02B 7/198* (2021.01)
  *G02B 26/10* (2006.01)

(52) U.S. Cl.
  CPC ........... *G02B 7/198* (2013.01); *G02B 26/101* (2013.01); *B81B 2201/04* (2013.01)

(58) Field of Classification Search
  USPC ...................................................... 359/223.1
  See application file for complete search history.

(56) References Cited

U.S. PATENT DOCUMENTS

| | | |
|---|---|---|
| 2010/0141366 A1 | 6/2010 | Sprague et al. |
| 2011/0169346 A1 | 7/2011 | Evers et al. |
| 2013/0003155 A1 | 1/2013 | Cugat et al. |
| 2016/0105090 A1 | 4/2016 | Sadaharu et al. |

FOREIGN PATENT DOCUMENTS

| | | | |
|---|---|---|---|
| CN | 104898308 | A | 9/2015 |
| CN | 105280324 | A | 1/2016 |
| CN | 105676447 | A | 6/2016 |
| CN | 205355397 | U | 6/2016 |
| CN | 105934698 | A | 9/2016 |
| CN | 105957707 | A | 9/2016 |
| CN | 205645427 | U | 10/2016 |
| DE | 10021896 | A1 | 11/2001 |
| EP | 1538473 | A1 | 6/2005 |
| EP | 3163352 | A1 | 5/2017 |
| JP | H8-334722 | A | 12/1996 |
| JP | 2005-164859 | A | 6/2005 |
| JP | 2007-312449 | A | 11/2007 |
| JP | 4012843 | B2 | 11/2007 |
| JP | 2013-508785 | | 3/2013 |
| JP | 2014-200140 | A | 10/2014 |
| JP | 2014-200140 | A | 10/2014 |
| JP | 2015-227900 | A | 12/2015 |
| JP | 2016-029880 | A | 3/2016 |
| JP | 2017-060205 | A | 3/2017 |
| WO | WO 02/074550 | A1 | 9/2002 |
| WO | WO 2011/051620 | A2 | 5/2011 |
| WO | WO-2015/015664 | A1 | 2/2015 |
| WO | WO 2016/002453 | A1 | 1/2016 |
| WO | WO 2017/126290 | A1 | 7/2017 |

OTHER PUBLICATIONS

Pau Guillamat et al., "Control of active liquid crystals with a magnetic field," Proceedings of the National Academy of Science, vol. 113, No. 2, May 2, 2016, p. 5498-p. 5502, XP055529378, XP055793763.

English-language translation of International Preliminary Report on Patentability (IPRP) dated Aug. 12, 2021 that issued in WO Patent Application No. PCT/JP2020/002147.

\* cited by examiner (a)

(b)

(a)

(b)

OPTICAL MODULE AND METHOD FOR MANUFACTURING OPTICAL MODULE

TECHNICAL FIELD

An aspect of the present invention relates to an optical module and a method for manufacturing the optical module.

BACKGROUND ART

Patent Literature 1 discloses a mirror device. The mirror device includes a mirror structure, a lower magnetic body, and a casing that accommodates these. The lower magnetic body is disposed on a bottom surface of an opening portion provided inside the casing. The mirror structure is positioned above the lower magnetic body. The lower magnetic body has a first magnetic portion, a second magnetic portion, and a third magnetic portion constituting a Halbach array.

CITATION LIST

Patent Literature

Patent Literature 1:PCT International Publication No. WO 2015/015664

SUMMARY OF INVENTION

Technical Problem

In Patent Literature 1, it is disclosed that a first magnetic portion, a second magnetic portion, and a third magnetic portion constituting a lower magnetic body may be members independent from each other. In this case, the lower magnetic body can be constituted by bonding a plurality of magnets corresponding to the first magnetic portion, the second magnetic portion, and the third magnetic portion to each other using an adhesive resin. However, if a plurality of magnets in a Halbach array are only fixed using an adhesive resin in this manner, there is a concern that a bonding interface will peel off and the magnets will be separated from each other, and thus there is room for improvement in reliability. In addition, in a bonding step using an adhesive resin, since the plurality of magnets in a Halbach array are fixed to each other, it can be expected that a workload will increase and costs will increase.

Thus, an object according to an aspect of the present invention is to provide an optical module and a method for manufacturing the optical module capable of improving the reliability and reducing costs.

Solution to Problem

According to an aspect of the present invention, there is provided an optical module including a mirror unit having a movable mirror portion including a coil, a magnet portion having an upper surface, a bottom surface, and a side surface extending from the upper surface to the bottom surface, and configured to generate a magnetic field acting on the movable mirror portion, and a package accommodating the magnet portion. The magnet portion has a Halbach structure including a first magnet including a first area of the bottom surface and applied with a force in a first direction from the upper surface to the bottom surface, and a second magnet including a second area of the upper surface and applied with a force in a second direction from the bottom surface to the upper surface. The package has a bottom wall portion configured to support the first area, a side wall portion configured to support the side surface, and a restriction portion configured to restrict movement of the second magnet in the second direction by covering at least a portion of the second area. The movable mirror portion is disposed in a space formed by the upper surface and the restriction portion.

In the optical module, a magnetic field acting on the movable mirror portion of the mirror unit is generated by the magnet portion accommodated in the package. The magnet portion has a Halbach structure including the first magnet and the second magnet. For example, due to interaction of a magnetic field with respect to the second magnet, a force acts on the first magnet in the first direction from the upper surface of the magnet portion to the bottom surface. Similarly, a force acts on the second magnet in the second direction from the bottom surface of the magnet portion to the upper surface. In contrast, the package uses the bottom wall portion to support at least the first area of the first magnet constituting the bottom surface of the magnet portion and uses the restriction portion to restrict the movement of the second area of the second magnet constituting the upper surface of the magnet portion by covering it. In addition, in the package, the side surface of the magnet portion is supported by the side wall portion. That is, relative movement caused by a force acting on each of the first magnet and the second magnets is restricted by the package. Accordingly, the first magnet and the second magnet can remain without separating from each other, and thus the reliability is improved. In addition, when the first magnet and the second magnet are combined, a constitution that requires an adhesive resin is avoided. Therefore, costs can be reduced. Since the movable mirror portion is disposed in the space formed by the upper surface of the magnet portion and the restriction portion, the movable mirror portion can approach the upper surface of the magnet portion, and a magnetic force of the magnet portion can be utilized efficiently. In addition, since the coil included in the movable mirror portion is disposed within the space, a magnetic force of the magnet portion can be utilized efficiently.

In the optical module according to the aspect of the present invention, the magnet portion may have a pair of second magnets disposed with the first magnet interposed therebetween. One second magnet of the pair of second magnets may include a first side part and a second side part of the second area. The restriction portion may cover at least a portion of the first side part and the second side part. In this case, movement of one of the pair of second magnets is restricted and thus the reliability can be improved with a minimum necessary constitution for the restriction portion.

In the optical module according to the aspect of the present invention, the other second magnet of the pair of second magnets may include a third side part and a fourth side part of the second area. The restriction portion may cover at least a portion of the third side part and form a leading-out portion of a wiring by exposing at least a portion of the fourth side part. In this case, movement of the other magnet of the pair of second magnets is restricted and thus the reliability can be improved with a minimum-required constitution of the restriction portion. In addition, the restriction portion can function as the leading-out portion of the wiring.

In the optical module according to the aspect of the present invention, the restriction portion may cover at least a portion of each of the two side parts of the upper surface.

In this case, movement of the second magnet is restricted and thus the reliability can be improved with a simple constitution.

In the optical module according to the aspect of the present invention, the restriction portion may cover at least a portion of each of the four side parts of the upper surface. In this case, movement of the second magnet is certainly restricted, and thus the reliability can be improved.

In the optical module according to the aspect of the present invention, a gap may be formed between the mirror unit and the restriction portion when viewed in a direction intersecting the upper surface. In this case, for example, an influence such as expansion, contraction, or an impact occurring in the package (restriction portion) is unlikely to be exerted on the mirror unit. In addition, for example, when the mirror unit is bonded to the upper surface of the magnet portion using a resin, excess resin can escape into the gap. Accordingly, a thickness of a resin layer interposed between the mirror unit and the upper surface of the magnet portion can be controlled with high accuracy. In addition, even if a large amount of resin is applied, the movable mirror portion can be brought close to the movable mirror portion since the resin can be formed more thinly by causing excess resin to escape into the gap, and thus a magnetic force of the magnet portion can be utilized efficiently.

In the optical module according to the aspect of the present invention, the bottom wall portion, the side wall portion, and the restriction portion may be integrally formed. In this case, the reliability is improved certainly and costs can be reduced.

In the optical module according to the aspect of the present invention, the movable mirror portion may have a movable portion, and a width of the movable portion along the upper surface may be smaller than a width of the first area. In this case, a magnetic field having a comparatively even intensity distribution from the magnet portion can act on the movable portion. In addition, when the magnetic field from the magnet portion has a comparatively even intensity distribution, it is easy to positionally align the movable portion with the magnet portion.

According to another aspect of the present invention, there is provided a method for manufacturing an optical module, including: a first step of preparing a mirror unit having a movable mirror portion including a coil, a package, and a magnet portion being accommodated in the package and having an upper surface, a bottom surface, and a side surface extending from the upper surface to the bottom surface, and a second step of disposing the mirror unit on the magnet portion subsequently to the first step. The magnet portion has a Halbach structure including a first magnet including a first area of the bottom surface and applied with a force in a first direction from the upper surface to the bottom surface, and a second magnet including a second area of the upper surface and applied with a force in a second direction from the bottom surface to the upper surface. The package has a bottom wall portion configured to support the first area, a side wall portion configured to support the side surface, and a restriction portion configured to restrict movement of the second magnet in the second direction by covering at least a portion of the second area. In the second step, the movable mirror portion is disposed in a space formed by the upper surface and the restriction portion.

In the method for manufacturing an optical module, in the first step, the mirror unit and the magnet portion accommodated in the package are prepared, and in the second step, the mirror unit is disposed on the magnet portion. The magnet portion has a Halbach structure including the first magnet and the second magnet. For example, due to interaction of a magnetic field with respect to the second magnet, a force acts on the first magnet in the first direction from the upper surface of the magnet portion to the bottom surface. Similarly, a force acts on the second magnet in the second direction from the bottom surface of the magnet portion to the upper surface. In contrast, the package uses the bottom wall portion to support at least the first area of the first magnet constituting the bottom surface of the magnet portion and uses the restriction portion to restrict the movement of the second area of the second magnet constituting the upper surface of the magnet portion by covering it. In addition, in the package, the side surface of the magnet portion is supported by the side wall portion. That is, relative movement caused by a force acting on each of the first magnet and the second magnets is restricted by the package. Accordingly, the first magnet and the second magnet are maintained without being separated from each other, and thus the reliability is improved. In addition, when the first magnet and the second magnet are combined, a constitution that requires an adhesive resin is avoided. Therefore, costs can be reduced. Moreover, in the second step, since the movable mirror portion is disposed in the space found by the upper surface of the magnet portion and the restriction portion of the package, the accuracy of the position of the movable mirror portion with respect to the magnet portion is improved. Since the movable mirror portion is disposed in the space formed by the upper surface of the magnet portion and the restriction portion, the movable mirror portion can approach the upper surface of the magnet portion, and a magnetic force of the magnet portion can be utilized efficiently. In addition, since the coil included in the movable mirror portion is disposed within the space, a magnetic force of the magnet portion can be utilized efficiently.

Advantageous Effects of Invention

According to the aspect of the present invention, an optical module and a method for manufacturing the optical module capable of improving the reliability and reducing costs can be provided.

DESCRIPTION OF EMBODIMENTS

An embodiment according to an aspect of the present invention will be described below in detail with reference to the drawings. In each of the drawings, the same reference signs are applied to constituent elements which are the same or corresponding, and duplicate description will be omitted in some cases.

Figure 1:
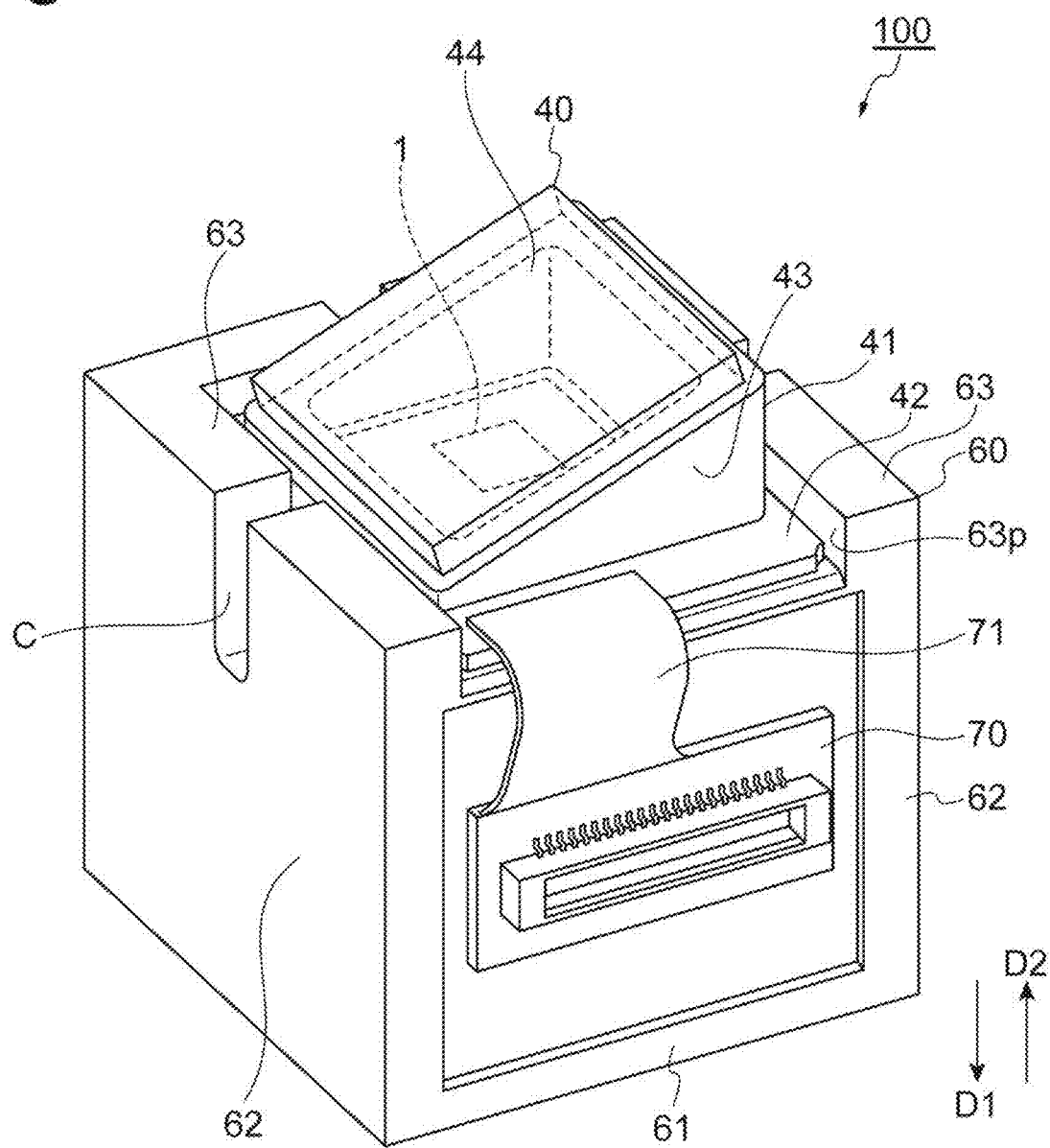
FIG. 1 is a perspective view illustrating an optical module according to the present embodiment.
Figure 2:
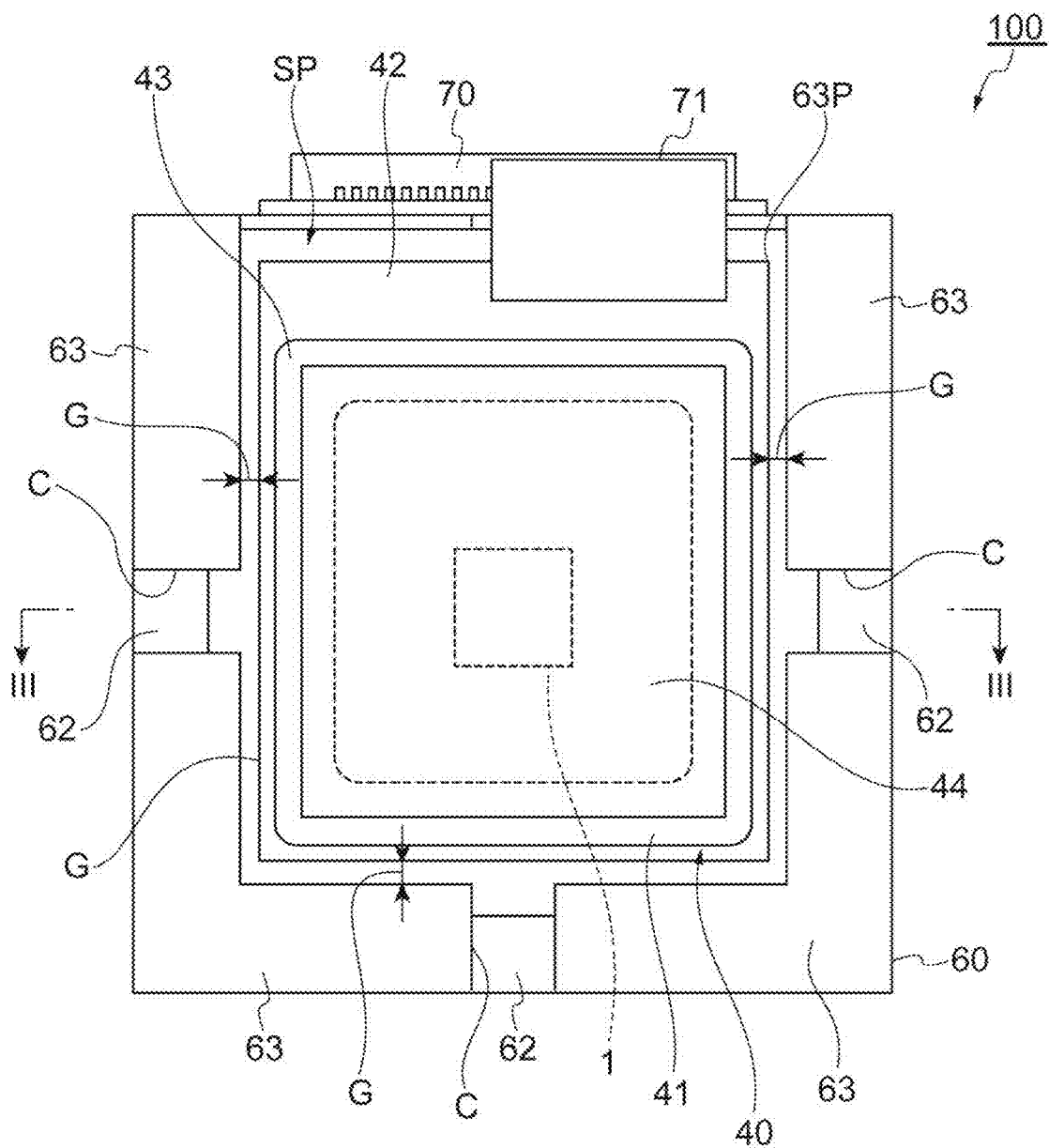
FIG. 2 is a plan view of the optical module illustrated in FIG. 1.
Figure 3:
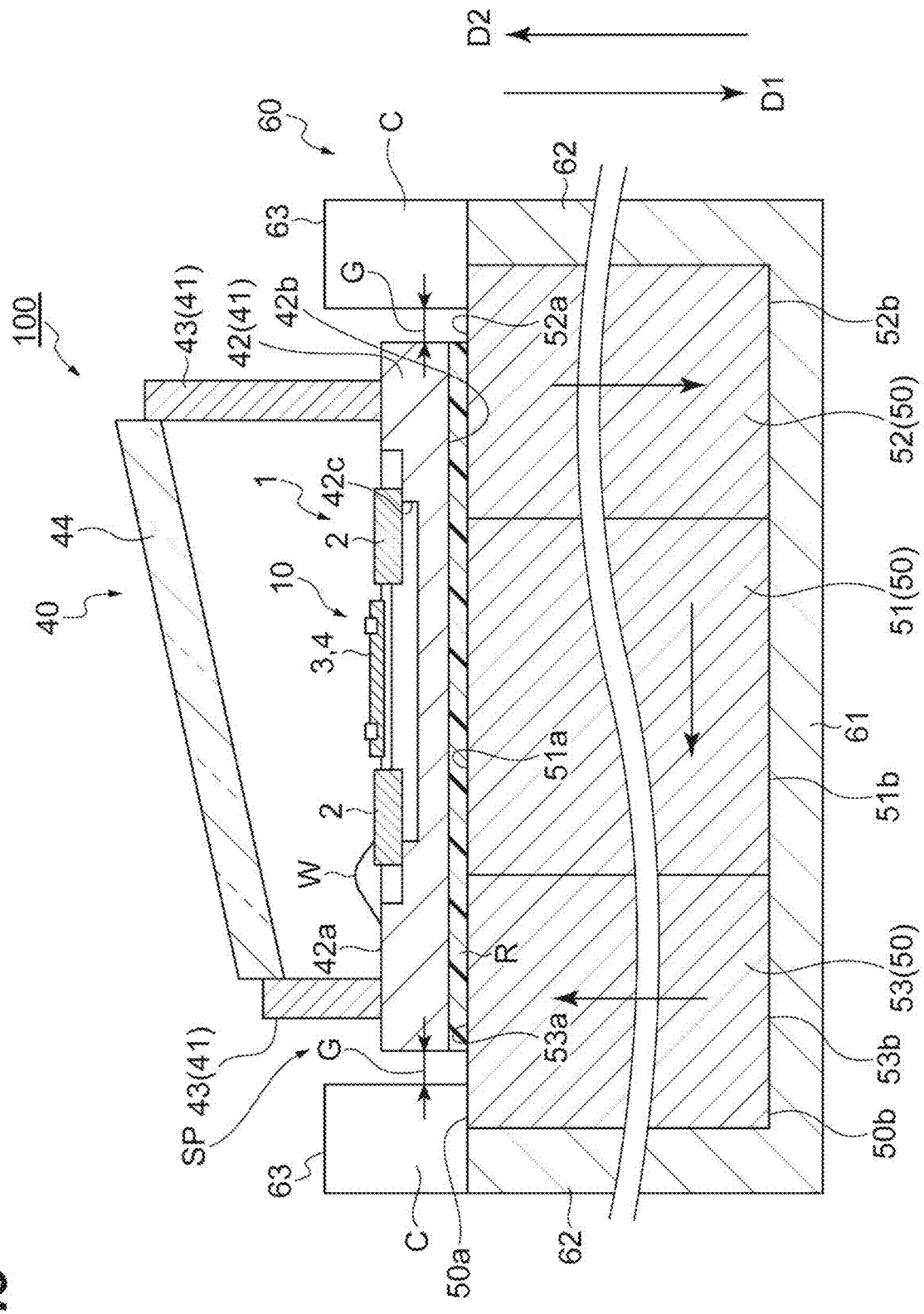
FIG. 3 is a schematic cross-sectional view taken along line in FIG. 2.
Figure 5:
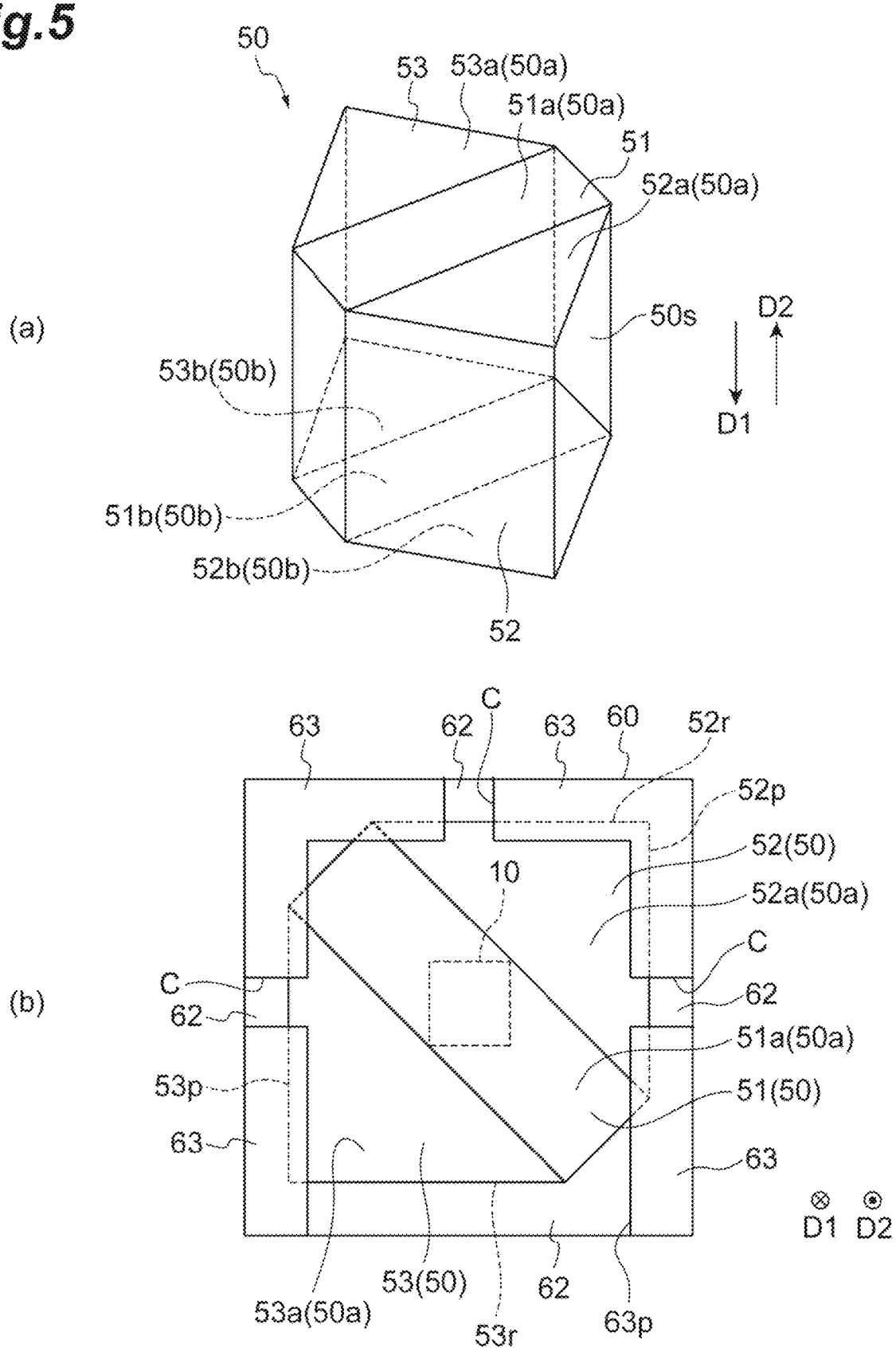
FIG. 5 is a view illustrating a magnet portion and a package.

FIG. 1 is a perspective view illustrating an optical module according to the present embodiment. FIG. 2 is a plan view of the optical module illustrated in FIG. 1. FIG. 3 is a schematic cross-sectional view taken along line III-III in FIG. 2. FIG. 5 is a view illustrating a magnet portion and a package. An optical module 100 illustrated in FIGS. 1 to 3 and 5 includes a mirror unit 40, a magnet portion 50, and a package 60. The mirror unit 40 has an electromagnetically-driven micro electro-mechanical system (MEMS) mirror 1 and a mirror package 41 accommodating the MEMS mirror 1. The mirror package 41 has a base 42, a side wall 43, and a window member 44.

For example, the base 42 is formed of a non-magnetic material such as aluminum nitride or aluminum oxide in a rectangular plate shape. For example, the side wall 43 is formed of non-magnetic material such as aluminum nitride or aluminum oxide in a rectangular cylinder shape. For example, the window member 44 is configured to be obtained by forming an antireflective film on both surfaces of a base material having a rectangular plate shape, which is formed of a transmissive material such as glass. The window member 44 is joined to the side wall 43, for example, using glass having a low melting point, such that one opening in the side wall 43 is hermetically sealed. The base 42 is joined to the side wall 43, for example, using glass having a low melting point, such that the other opening in the side wall 43 is hermetically sealed. An opening (that is, an opening sealed by the window member 44) in one of the window member 44 and the side wall 43 faces the base 42. The base 42 and the side wall 43 may be integrally formed of a non-magnetic material.

For example, a support portion 2 of the MEMS mirror 1 is attached to an inner surface 42a (face on a surface of the base 42 constituting an inner surface of the mirror package 41) of the base 42 using a resin. For example, the magnet portion 50 is attached to an outer surface 42b (face on a surface of the base 42 constituting an outer surface of the mirror package 41) of the base 42 using a resin. The magnet portion 50 faces a first movable portion 3 of the MEMS mirror 1 with the base 42 therebetween. The magnet portion 50 will be described below in detail.

Figure 4:
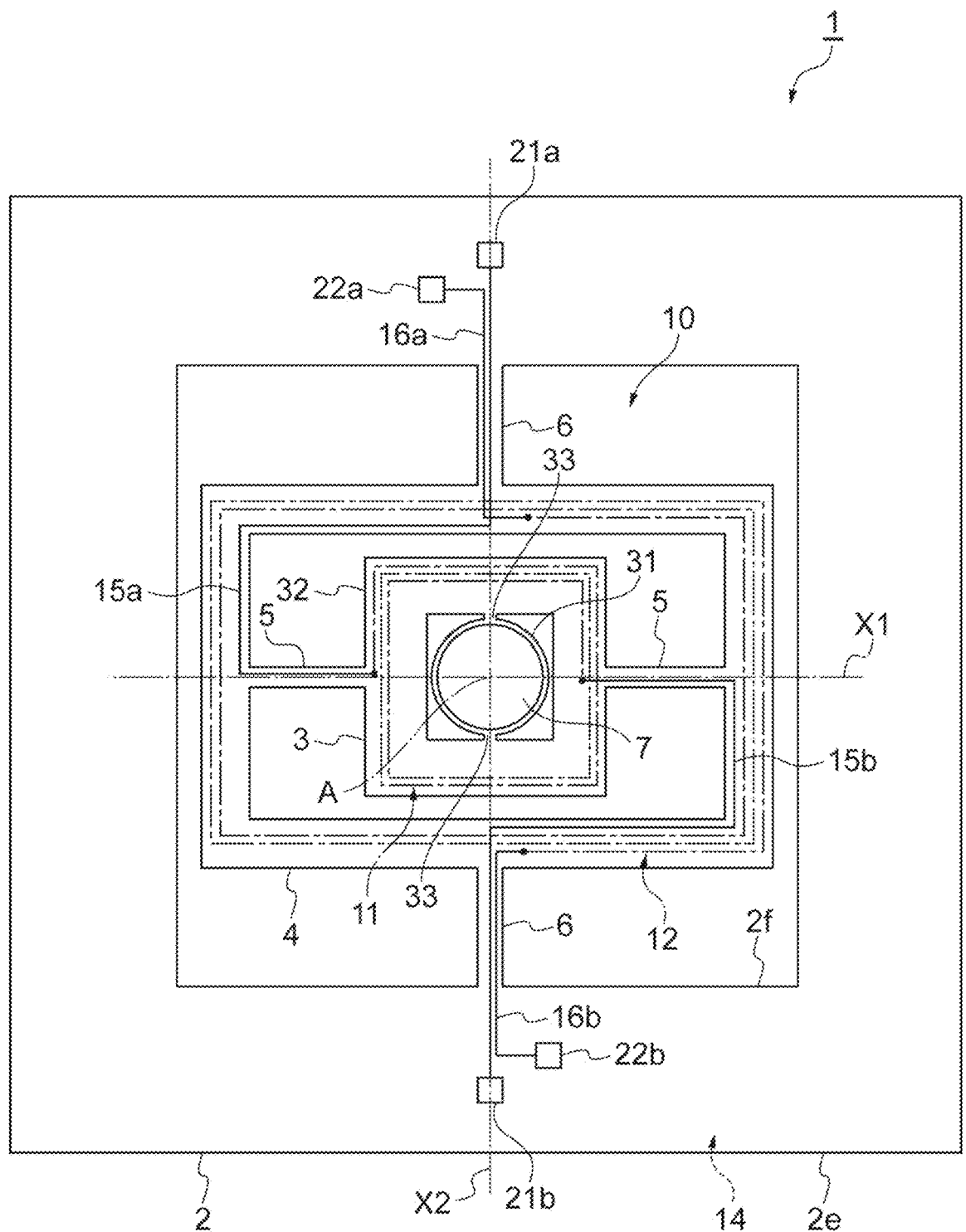
FIG. 4 is a plan view of an MEMS mirror illustrated in FIG. 1.

FIG. 4 is a plan view of the MEMS mirror illustrated in FIG. 1. As illustrated in FIG. 4, the MEMS mirror 1 has the support portion 2, and a movable mirror portion 10 that includes a first movable portion (movable portion) 3, a second movable portion (movable portion) 4, a pair of first coupling portions 5, a pair of second coupling portions 6, and a mirror 7. The support portion 2, the first movable portion 3, the second movable portion 4, the pair of first coupling portions 5, and the pair of second coupling portions 6 are integrally formed of silicon, for example.

For example, the first movable portion 3 is formed to have a rectangular plate shape. For example, the second movable portion 4 is formed to have a rectangular ring shape, such that the first movable portion 3 is surrounded with a gap therebetween when viewed in an optical axis direction A. For example, the support portion 2 is formed to have a rectangular frame shape, such that the second movable portion 4 is surrounded with a gap therebetween when viewed in the optical axis direction A. That is, the support portion 2 is formed to have a frame shape, such that the first movable portion 3 and the second movable portion 4 are surrounded when viewed in the optical axis direction A.

The first movable portion 3 is coupled to the second movable portion 4 with the pair of first coupling portions 5 therebetween, such that it can oscillate around a first axis X1. That is, the first movable portion 3 is supported such that it can oscillate around the first axis X1 in the support portion 2. The first movable portion 3 includes a first part 31 and a second part 32. For example, the first part 31 is formed to have a circular shape when viewed in the optical axis direction A. For example, the second part 32 is formed to have a rectangular ring shape when viewed in the optical axis direction A. The first part 31 is surrounded by the second part 32 when viewed in the optical axis direction A, and is connected to the second part 32 with a plurality of (here, two) connection portions 33 therebetween. That is, a gap is formed between the first part 31 and the second part 32 except for at the plurality of connection portions 33.

For example, the connection portion 33 is positioned in a center portion between two sides intersecting a second axis X2 at an inner edge of the rectangular second part 32. That is, the connection portion 33 here is positioned on the second axis X2. The first part 31 may be connected to the second part 32 in a direction along at least the second axis X2. The second movable portion 4 is coupled to the support portion 2 with the pair of second coupling portions 6 therebetween, such that it can oscillate around the second axis X2. That is, the second movable portion 4 is supported on the support portion 2 such that it can oscillate around the second axis X2. The first axis X1 and the second axis X2 are perpendicular to the optical axis direction A and intersect each other (here, they are orthogonal to each other). The first part 31 may be formed to have a rectangular shape or a polygonal shape when viewed in the optical axis direction A. In addition, the first part 31 may be formed to have a circular shape (for example, an elliptical shape) when viewed in the optical axis direction A. The second part 32 may be formed to have a polygonal ring shape having five or more faces or a ring shape when viewed in the optical axis direction A.

The pair of first coupling portions 5 is disposed on the first axis X1 with the first movable portion 3 interposed therebetween in a gap between the second part 32 of the first movable portion 3 and the second movable portion 4. Each of the first coupling portions 5 functions as a torsion bar. The pair of second coupling portions 6 are disposed on the second axis X2 with the second movable portion 4 interposed therebetween in a gap between the second movable portion 4 and the support portion 2. Each of the second coupling portions 6 functions as a torsion bar.

The mirror 7 is provided on the first part 31 of the first movable portion 3. The mirror 7 is formed on one surface (surface on the window member 44 side) of the first part 31 in a manner of including an intersection of the first axis X1 and the second axis X2. For example, the mirror 7 is formed of a metal material such as aluminum, an aluminum-based alloy, gold, or silver in a film shape of a circle, an ellipse, or a rectangle film. The center of the mirror 7 coincides with an intersection of the first axis X1 and the second axis X2 when viewed in the optical axis direction A. In this manner, since the mirror 7 is provided on the first part 31 connected to the second part 32 with the plurality of connection portions 33 therebetween, even if the first movable portion 3 oscillates around the first axis X1 at a resonance frequency level, occurrence of deformation such as deflection in the mirror 7 is curbed.

Moreover, the MEMS mirror 1 has a first drive coil (coil) 11, a second drive coil (coil) 12, wirings 15a and 15b, wirings 16a and 16b, electrode pads 21a and 21b, and electrode pads 22a and 22b. In FIG. 2, for the convenience of description, the first drive coil 11 and the second drive coil 12 are indicated by one-dot dashed lines, and the wirings 15a and 15b and the wirings 16a and 16b are indicated by solid lines.

The first drive coil 11 is provided on the second part 32 of the first movable portion 3. The first drive coil 11 is wound a plurality of times in a spiral shape (helical shape) in an area (that is, the second portion 32) outside of the mirror 7 when viewed in the optical axis direction. A magnetic field generated by the magnet portion 50 acts on the first drive coil 11.

The first drive coil 11 is disposed within a groove formed on a surface of the first movable portion 3. That is, the first drive coil 11 is embedded in the first movable portion 3. One end of the first drive coil 11 is connected to the electrode pad 21a with the wiring 15a therebetween. The wiring 15a extends from the first movable portion 3 to the support portion 2 with one first coupling portion 5, the second movable portion 4, and one second coupling portion 6 therebetween. For example, the wiring 15a and the electrode pad 21a are integrally formed of a metal material such as tungsten, aluminum, gold, silver, copper, or an aluminum-based alloy. The first drive coil 11 and the wiring 15a are connected to each other.

The other end of the first drive coil 11 is connected to the electrode pad 21b with the wiring 15b therebetween. The wiring 15b extends from the first movable portion 3 to the support portion 2 with the other first coupling portion 5, the second movable portion 4, and the other second coupling portion 6 therebetween. For example, the wiring 15b and the electrode pad 21b are integrally formed of a metal material such as tungsten, aluminum, gold, silver, copper, or an aluminum-based alloy. The first drive coil 11 and the wiring 15b are connected to each other.

The second drive coil 12 is provided on the second movable portion 4. The second drive coil 12 is wound a plurality of times in a spiral shape (helical shape) in the second movable portion 4. A magnetic field generated by the magnet portion 50 acts on the second drive coil 12. The second drive coil 12 is disposed within a groove formed on a surface of the second movable portion 4. That is, the second drive coil 12 is embedded in the second movable portion 4.

One end of the second drive coil 12 is connected to the electrode pad 22a with the wiring 16a therebetween. The wiring 16a extends from the second movable portion 4 to the support portion 2 with one second coupling portion 6 therebetween. For example, the wiring 16a and the electrode pad 22a are integrally formed of a metal material such as tungsten, aluminum, gold, silver, copper, or an aluminum-based alloy. The second drive coil 12 and the wiring 16a are connected to each other.

The other end of the second drive coil 12 is connected to the electrode pad 22b with the wiring 16b therebetween. The wiring 16b extends from the second movable portion 4 to the support portion 2 with the other second coupling portion 6 therebetween. For example, the wiring 16b and the electrode pad 22b are integrally formed of a metal material such as tungsten, aluminum, gold, silver, copper, or an aluminum-based alloy. The second drive coil 12 and the wiring 16b are connected to each other.

An example of an operation of the movable mirror portion 10 in the MEMS mirror 1 will be described. Regarding a first example, a high-frequency driving current is applied to the first drive coil 11. At this time, since a magnetic field generated by the magnet portion 50 acts on the first drive coil 11, a Lorentz force is generated in the first drive coil 11. Accordingly, for example, the first movable portion 3 oscillates around the first axis X1 at a resonance frequency level.

In addition, a driving current having a constant magnitude is applied to the second drive coil 12. At this time, since a magnetic field generated by the magnet portion 50 acts on the second drive coil 12, a Lorentz force is generated in the second drive coil 12. Accordingly, for example, the second movable portion 4 is rotated around the second axis X2 in accordance with the magnitude of the driving current and stops in such a state. Consequently, according to the MEMS mirror 1, scanning of light from a predetermined light source can be performed while the light is reflected by the mirror 7. In the first example, the first movable portion 3 oscillates at a resonance frequency, and the second movable portion 4 is used statically.

Regarding a second example, similar to the operation of the first movable portion 3 in the first example, when a high-frequency driving current is applied to the first drive coil 11, the first movable portion 3 oscillates in accordance with the resonance frequency, and when a high-frequency driving current is applied to the second drive coil 12, the second movable portion 4 oscillates in accordance with the resonance frequency. In this manner, in this second example, both the first movable portion 3 and the second movable portion 4 oscillate at the resonance frequency.

Regarding a third example, similar to the operation of the second movable portion 4 in the first example, when a driving current having a constant magnitude is applied to the first drive coil 11, the first movable portion 3 rotates around the first axis X1 in accordance with the magnitude of the driving current and stops, and when a driving current having a constant magnitude is applied to the second drive coil 12, the second movable portion 4 rotates around the second axis X2 in accordance with the magnitude of the driving current and stops. In this manner, in this third example, both the first movable portion 3 and the second movable portion 4 are used statically.

A fourth example is a case where the second movable portion 4 is not provided, for example. When a high-frequency driving current is applied to the first drive coil 11, only the first movable portion 3 oscillates in accordance with the resonance frequency. Moreover, a fifth example is a similar case. When a driving current having a constant magnitude is applied to the first drive coil 11, the first movable portion 3 rotates around the first axis X1 in accordance with the magnitude of the driving current and stops. In the fourth example and fifth example, only the first movable portion 3 is used in an oscillating manner or a static manner. As illustrated in FIG. 3, a recessed portion 42c is formed on the inner surface 42a of the base 42 such that it faces the first movable portion 3 and the second movable portion 4. Due to the recessed portion 42c, the first movable portion 3 and the second movable portion 4 can oscillate without interfering with the base 42.

With reference to FIGS. 1 to 3 and 5 again, the magnet portion 50 generates a magnetic field acting on the mirror unit 40 (MEMS mirror 1). The magnet portion 50 has an upper surface 50a, a bottom surface 50b on a side opposite to the upper surface 50a, and a side surface 50s extending from the upper surface 50a to the bottom surface 50b and connecting the upper surface 50a and the bottom surface 50b to each other. The magnet portion 50 exhibits a polygonal columnar shape. Here, the magnet portion 50 has a hexagonal columnar shape. Therefore, the upper surface 50a and the bottom surface 50b have a hexagonal columnar shape, and the side surface 50s has a hexagonal ring shape. The upper surface 50a and the bottom surface 50b are substantially in parallel with each other.

The magnet portion 50 is constituted of a combination of a plurality of magnets. Here, the magnet portion 50 includes a first magnet 51 and a pair of second magnets 52 and 53 disposed with the first magnet interposed therebetween. The first magnet 51 has a polygonal columnar shape (here, a square columnar shape) extending from the upper surface 50a to the bottom surface 50b. Therefore, an end surface of the first magnet 51 constitutes a portion of an area of the upper surface 50a and the bottom surface 50b. More specifically, the first magnet 51 includes an area 51a of the upper surface 50a and an area (first area) 51b of the bottom surface 50b.

Each of the second magnets 52 and 53 has in a polygonal columnar shape (here, a triangular columnar shape) extending from the upper surface 50a to the bottom surface 50b. Therefore, end surfaces of the second magnets 52 and 53 constitute a portion of an area of the upper surface 50a and the bottom surface 50b. More specifically, the second magnet 52 includes an area (second area) 52a of the upper surface 50a and an area 52b of the bottom surface 50b. In addition, the second magnet 53 includes an area (second area) 53a of the upper surface 50a, and an area 53b of the bottom surface 50b. Here, the upper surface 50a is constituted of the areas 51a, 52a, and 53a, and the bottom surface 50b is constituted of the areas 51b, 52b, and 53b.

Here, each of the areas 52a and 53a of the second magnets 52 and 53 exhibits a triangular shape. Therefore, the area 52a of the second magnet 52 includes a first side part 52p and a second side part 52r facing the outside of the magnet portion 50. In addition, the area 53a of the second magnet 53 includes a third side part 53p and a fourth side part 53r facing the outside of the magnet portion 50.

The first magnet 51 and the second magnets 52 and 53 are arrayed such that their magnetic poles constitute a Halbach array (that is, such that the magnet portion 50 has a Halbach structure). Here, the second magnet 52 is disposed such that a first magnetic pole (for example, N-pole) is positioned on the bottom surface 50b side and a second magnetic pole (for example, S-pole) is positioned on the upper surface 50a side. The second magnet 53 is disposed toward a side opposite to that of the second magnet 52. That is, the second magnet 53 is disposed such that a first magnetic pole is positioned on the upper surface 50a side and a second magnetic pole is positioned on the bottom surface 50b side. On the other hand, the first magnet 51 is disposed such that a first magnetic pole is positioned on the second magnet 53 side and a second magnetic pole is positioned on the second magnet 52 side.

The first magnet 51 and the second magnets 52 and 53 are combined such that they are disposed in an array of magnetic poles as described above. Accordingly, due to an attraction force and a repulsion force between the magnetic poles, a force acts on the first magnet 51 in a first direction D1 from the upper surface 50a to the bottom surface 50b. On the other hand, a force acts on the second magnets 52 and 53 in a second direction D2 from the bottom surface 50b to the upper surface 50a. Therefore, there is a need for a constitution for integrally holding the magnet portion 50. In the present embodiment, the package 60 has such a function.

The package 60 accommodates the magnet portion 50. The package 60 includes a bottom wall portion 61, a side wall portion 62, and a restriction portion 63. The bottom wall portion 61, the side wall portion 62, and the restriction portion 63 are integrally formed. The package 60 in its entirety exhibits a square shape. The bottom wall portion 61 exhibits a rectangular flat plate shape. The bottom wall portion 61 comes into contact with the bottom surface 50b of the magnet portion 50 and supports the bottom surface 50b. That is, the bottom wall portion 61 supports the area 51b of the first magnet 51, the area 52b of the second magnet 52, and the area 53b of the second magnet 53.

The side wall portion 62 stands upright along an outer edge of the bottom wall portion 61. Therefore, here, the side wall portion 62 has a rectangular ring shape. The side wall portion 62 comes into contact with the side surface 50s of the magnet portion 50 and supports the side surface 50s.

The restriction portion 63 is provided on an end portion of the side wall portion 62 on a side opposite to the bottom wall portion 61. The restriction portion 63 is provided on a portion of the end portion of the side wall portion 62 and is formed to have a substantially U-shaped frame when viewed in a direction along the side wall portion 62. The restriction portion 63 extends from the side wall portion 62 in a manner projecting upward on the upper surface 50a. Accordingly, the restriction portion 63 comes into contact with at least a portion of the upper surface 50a and supports the upper surface 50a. More specifically, the restriction portion 63 covers three side parts of the hexagonal upper surface 50a. Particularly, the restriction portion 63 covers and supports a greater part (for example, the entirety (the same applies hereinafter)) of the first side part 52p of the area 52a of the second magnet 52 and covers and supports a greater part of the second side part 52r.

Moreover, the restriction portion 63 covers and supports a greater part of the third side part 53p of the area 53a of the second magnet 53. However, the restriction portion 63 releases (does not cover) the fourth side part 53r of the area 53a of the second magnet 53s such that it is exposed. As will be described below, a released part 63p of the restriction portion 63 forms a leading-out portion of a wiring portion. Here, the restriction portion 63 covers three of four corner portions of the area 51a of the first magnet 51.

In this manner, in the package 60, the bottom wall portion 61, the side wall portion 62, and the restriction portion 63 support each surface of the magnet portion 50 and holds the magnet portion 50 mechanically and integrally. As described above, a force acts on the first magnet 51 in the first direction D1 from the upper surface 50a to the bottom surface 50b. In contrast, in the package 60, movement of the first magnet 51 and the second magnets 52 and 53 within a surface intersecting (orthogonal to) the first direction D1 is restricted due to the side wall portion 62, and movement of the first magnet 51 in the first direction D1 is restricted due to the bottom wall portion 61.

On the other hand, a force acts on the second magnets 52 and 53 in the second direction D2 from the bottom surface 50b to the upper surface 50a. In the package 60, a portion (the first side part 52p, the second side part 52r, and the third side part 53p) of the areas 52a and 53a of the second magnets 52 and 53 is supported by the restriction portion 63. Accordingly, the restriction portion 63 restricts movement of the second magnets 52 and 53 in the second direction D2. As a result of these, separation of the first magnet 51 and the second magnets 52 and 53 constituting the magnet portion 50 is curbed and the magnet portion 50 is held integrally.

The package 60 described above is molded integrally, for example, through insertion molding in a state where the magnet portion 50 is accommodated. Specifically, in this example, while the magnet portion 50 is disposed in a mold and then the first magnet 51 and the second magnets 52 and 53 are held such that they are not separated from each other, the package 60 is molded integrally by introducing a resin into the mold. Accordingly, in this example, a plurality of notches C for holding the first magnet 51 and the second magnets 52 and 53 are provided.

That is, the package 60 has a through-hole portion such as a plurality of notches or a plurality of holes through insertion molding. In this manner, in a case where the package 60 (the bottom wall portion 61, the side wall portion 62, and the restriction portion 63) is formed integrally, for example, the magnet portion 50 can be fixed to the package 60 with more favorable position accuracy than that in a case where members constituted as separate bodies are fixed to each other using a screw or the like. As a material of the package 60, a resin classified as super-engineering plastic or engineering plastic is preferably adopted. Examples thereof include polyphenylene sulfide (PPS), liquid crystal polymer (LCP), polyether ether ketone (PEEK), and the like. Moreover, the material of the package 60 may be filler-reinforced for improvement in mechanical strength and heat resistance.

Here, the mirror unit 40 (that is, the movable mirror portion 10) is disposed in a space SP formed by the upper surface 50a of the magnet portion 50 and the restriction portion 63. More specifically, the upper surface 50a of the magnet portion 50 is exposed except for the part overlapping the restriction portion 63 when viewed in a direction intersecting (orthogonal to) the upper surface 50a. Accordingly, the space SP is formed by the exposed portion of the upper surface 50a and the restriction portion 63, and the mirror unit 40 is disposed in the space SP. In such a state, in the mirror unit 40, the outer surface 42b of the base 42 is bonded to the upper surface 50a using an adhesive resin R. In addition, here, the mirror unit 40 is not in contact with the restriction portion 63. Accordingly, a gap G is formed between the mirror unit 40 and the restriction portion 63 when viewed in a direction intersecting the upper surface 50a.

In addition, in a state where the mirror unit 40 is disposed on the magnet portion 50, at least the movable mirror portion 10 of the MEMS mirror 1 is positioned on the area 51a of the first magnet 51 when viewed in a direction intersecting (orthogonal to) the upper surface 50a. In addition, a width of the movable mirror portion 10 (that is, the movable portion) along the upper surface 50a is smaller than a width of the first magnet 51 along the upper surface 50a. More specifically, here, a maximum value for dimensions of the movable mirror portion 10 (here, the second movable portion 4 (movable portion)) along the upper surface 50a is smaller than a minimum value for dimensions of the area 51a. Accordingly, the entire movable mirror portion 10 is positioned on the area 51a. Accordingly, a magnetic field having a comparatively even intensity distribution can act on the first drive coil 11 and the second drive coil 12. In addition, since the width of the movable portion (the first movable portion 3 and the second movable portion 4) is smaller than the width of the first magnet 51, the magnetic field has a comparatively even intensity distribution. Consequently, it is easy to positionally align the movable portion with the magnet portion 50. Moreover, since the width of the movable mirror portion 10 is smaller than the width of the first magnet 51, an area having an even intensity distribution expands. Consequently, it is easier to perform positional alignment.

In addition, the optical module 100 further includes a connector 70 and a wiring portion 71 connected to the connector 70. The connector 70 is embedded within the side wall portion 62 of the package 60. The wiring portion 71 extends from the connector 70, is introduced into the space SP through the released part 63p of the restriction portion 63, and is connected to the optical module 100 (for example, the base 42). Accordingly, the MEMS mirror 1 is electrically connected to the wiring portion 71 by a wire W, for example.

Accordingly, the released part 63p of the package 60 forms a leading-out portion of the wiring portion 71.

Subsequently, a method for manufacturing the optical module 100 will be described. In this method, first, the mirror unit 40, the package 60, and the magnet portion 50 accommodated in the package 60 are prepared (first step). Subsequently, the mirror unit 40 is disposed on the magnet portion 50 (second step). At this time, in the step of disposing the mirror unit 40, the mirror unit 40 is disposed in the space SP formed by the upper surface 50a of the magnet portion 50 and the restriction portion 63 of the package 60. In addition, at this time, the mirror unit 40 is prevented from coming into contact with the restriction portion 63 (that is, the gap G is formed between the mirror unit 40 and the restriction portion 63). Then, the optical module 100 is constituted by bonding the mirror unit 40 to the magnet portion 50.

As described above, in the optical module 100, a magnetic field acting on the movable mirror portion 10 (the first drive coil 11 and the second drive coil 12) is generated by the magnet portion 50 accommodated in the package 60. The magnet portion 50 has a Halbach structure including the first magnet 51 and the second magnets 52 and 53. For example, due to interaction of a magnetic field with respect to the second magnets 52 and 53, a force acts on the first magnet 51 in the first direction D1 from the upper surface 50a of the magnet portion 50 to the bottom surface 50b. Similarly, a force acts on the second magnets 52 and 53 in the second direction D2 from the bottom surface 50b of the magnet portion 50 to the upper surface 50a.

In contrast, the package 60 uses the bottom wall portion 61 to support at least the area 51b of the first magnet 51 constituting the bottom surface 50b of the magnet portion 50 and uses the restriction portion 63 to restrict the movement of the areas 52a and 53a of the second magnets 52 and 53 constituting the upper surface 50a of the magnet portion 50 by covering them. In addition, in the package 60, the side surface of the magnet portion 50 is supported by the side wall portion 62. That is, in the first magnet 51 and the second magnets 52 and 53, relative movement caused by a force acting on each of the magnets is restricted by the package 60. Accordingly, the first magnet 51 and the second magnets 52 and 53 are maintained without being separated from each other, and thus the reliability is improved. In addition, when the first magnet 51 and the second magnets 52 and 53 are combined, a constitution that requires an adhesive resin is avoided. Therefore, costs can be reduced.

In the optical module 100, since the movable mirror portion 10 is disposed in the space SP formed by the upper surface 50a of the magnet portion 50 and the restriction portion 63, it can approach the upper surface 50a of the magnet portion 50, and a magnetic force of the magnet portion 50 can be utilized efficiently. In addition, since the first drive coil 11 and the second drive coil 12 are disposed within the space SP, a magnetic force of the magnet portion 50 can be utilized efficiently. The first drive coil 11 and the second drive coil 12 do not have to be disposed within the space SP. In addition, in a case where the movable mirror portion 10 is disposed within the space SP, the movable portion need only be partially present within the space SP when the movable portion has the maximum displacement (deflection angle) to the upper surface 50a side of the magnet portion 50.

In addition, in the optical module 100, the magnet portion 50 has the pair of second magnets 52 and 53 disposed with the first magnet 51 interposed therebetween. One second magnet 52 of the pair of second magnets 52 and 53 includes the first side part 52p and the second side part 52r of the area 52a. Then, the restriction portion 63 covers at least a portion of the first side part 52p and the second side part 52r. In this manner, movement of one of the pair of second magnets 52 and 53 is restricted and thus the reliability can be improved with a minimum-required constitution of the restriction portion 63.

In addition, in the optical module 100, the remaining second magnet 53 of the pair of second magnets 52 and 53 includes the third side part 53p and the fourth side part 53r of the area 53a. The restriction portion 63 forms the leading-out portion of the wiring portion 71 by covering at least a portion of the third side part 53p and exposing at least a portion of the fourth side part 53r. In this manner, movement of the remaining magnet of the pair of second magnets 52 and 53 is restricted and thus the reliability can be improved with a minimum-required constitution of the restriction portion 63. In addition, the restriction portion 63 can function as the leading-out portion of the wiring portion 71.

In addition, in the optical module 100, the restriction portion 63 covers at least a portion of each of the two side parts (for example, the first side part 52p and the third side part 53p) of the upper surface 50a of the magnet portion 50. Accordingly, movement of the second magnets 52 and 53 are restricted and thus that the reliability can be improved with a simple constitution.

In addition, in the optical module 100, the gap G is formed between the mirror unit 40 and the restriction portion 63 when viewed in a direction intersecting the upper surface 50a. Accordingly, for example, an influence such as expansion, contraction, or an impact occurring in the package 60 (restriction portion 63) is unlikely to be exerted on the mirror unit 40. In addition, for example, when the mirror unit 40 is bonded on the upper surface 50a of the magnet portion 50 using a resin, excess resin can escape into the gap G. Accordingly, a thickness of a resin layer interposed between the mirror unit 40 and the upper surface 50a of the magnet portion 50 can be controlled with high accuracy.

Moreover, in the optical module 100, the bottom wall portion 61, the side wall portion 62, and the restriction portion 63 are integrally formed. Accordingly, the reliability is improved certainly and costs can be reduced.

The foregoing embodiment is an embodiment describing the optical module and the method for manufacturing the optical module according to the aspect of the present invention. Therefore, the optical module and the method for manufacturing the optical module according to the aspect of the present invention are not limited to those described above and can be changed arbitrarily.

Figure 6:
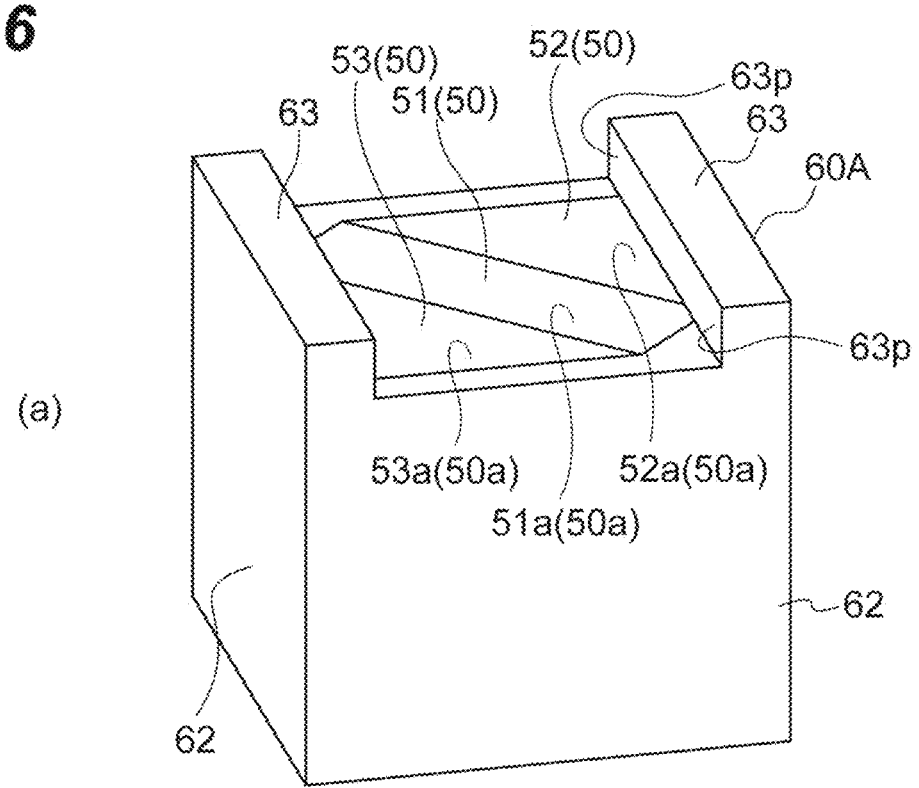
FIG. 6 is a view illustrating a package according to a modification example.
Figure 6:
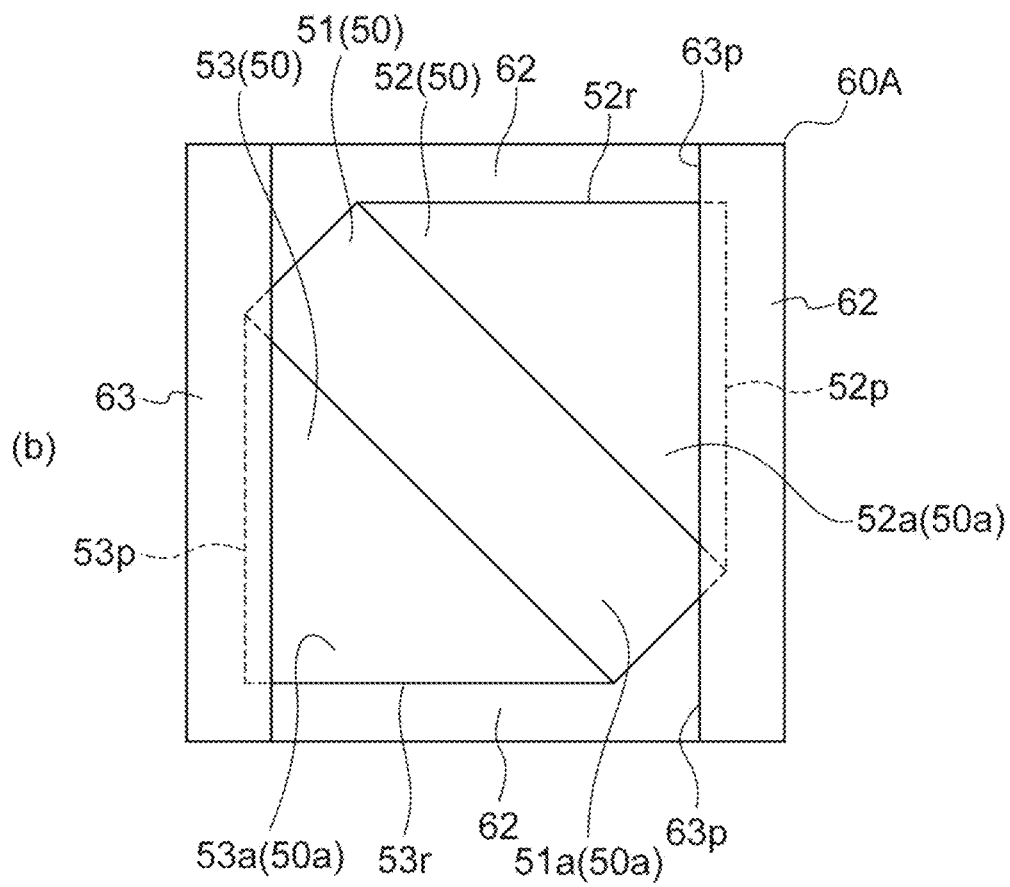

For example, the package 60 can be modified as a package 60A as illustrated in FIG. 6. In the package 60A, the restriction portion 63 covers and supports a greater part (here, the entirety) of the first side part 52p of the area 52a of the second magnet 52 and releases and exposes the second side part 52r. In addition, here, the restriction portion 63 covers and supports a greater part (here, the entirety) of the third side part 53p of the area 53a of the second magnet 53 and releases and exposes the fourth side part 53r.

Figure 7:
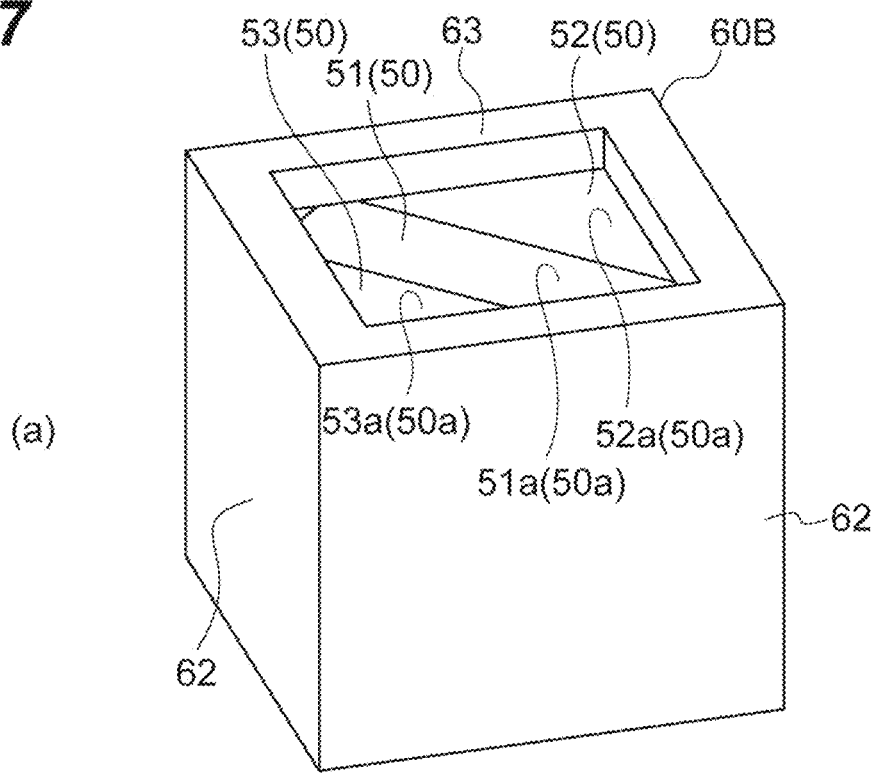
FIG. 7 is a view illustrating a package according to another modification example.
Figure 7:
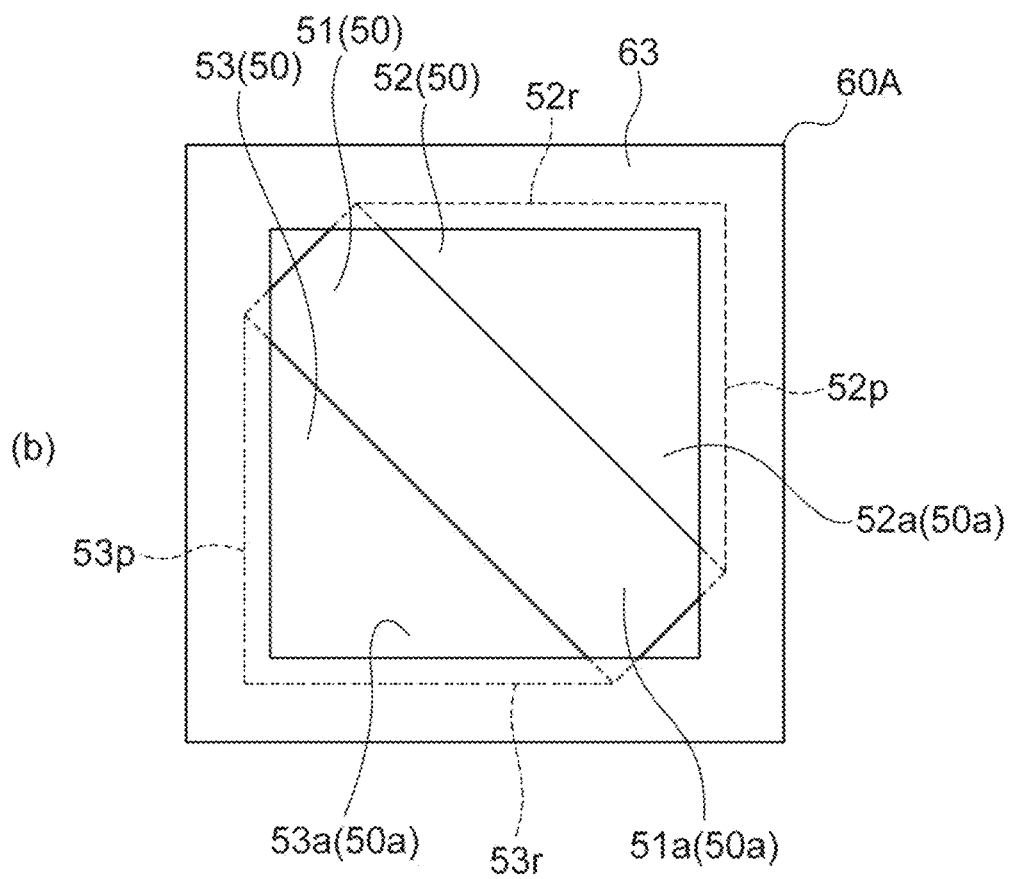

In addition, the package 60 can be modified as a package 60B illustrated in FIG. 7. In the package 60B, the restriction portion 63 covers and supports a greater part (here, the entirety) of the first side part 52p and the second side part 52r of the area 52a of the second magnet 52, and covers and supports a greater part (here, the entirety) of the third side part 53p and the fourth side part 53r of the area 53a of the second magnet 53. That is, here, the restriction portion 63 supports all side parts facing the outside of the areas 52a and 53b. Accordingly, here, the restriction portion 63 covers four side parts of the upper surface 50a of the magnet portion 50. Accordingly, movement of the second magnets 52 and 53 is certainly restricted, and thus the reliability can be improved.

Figure 8:
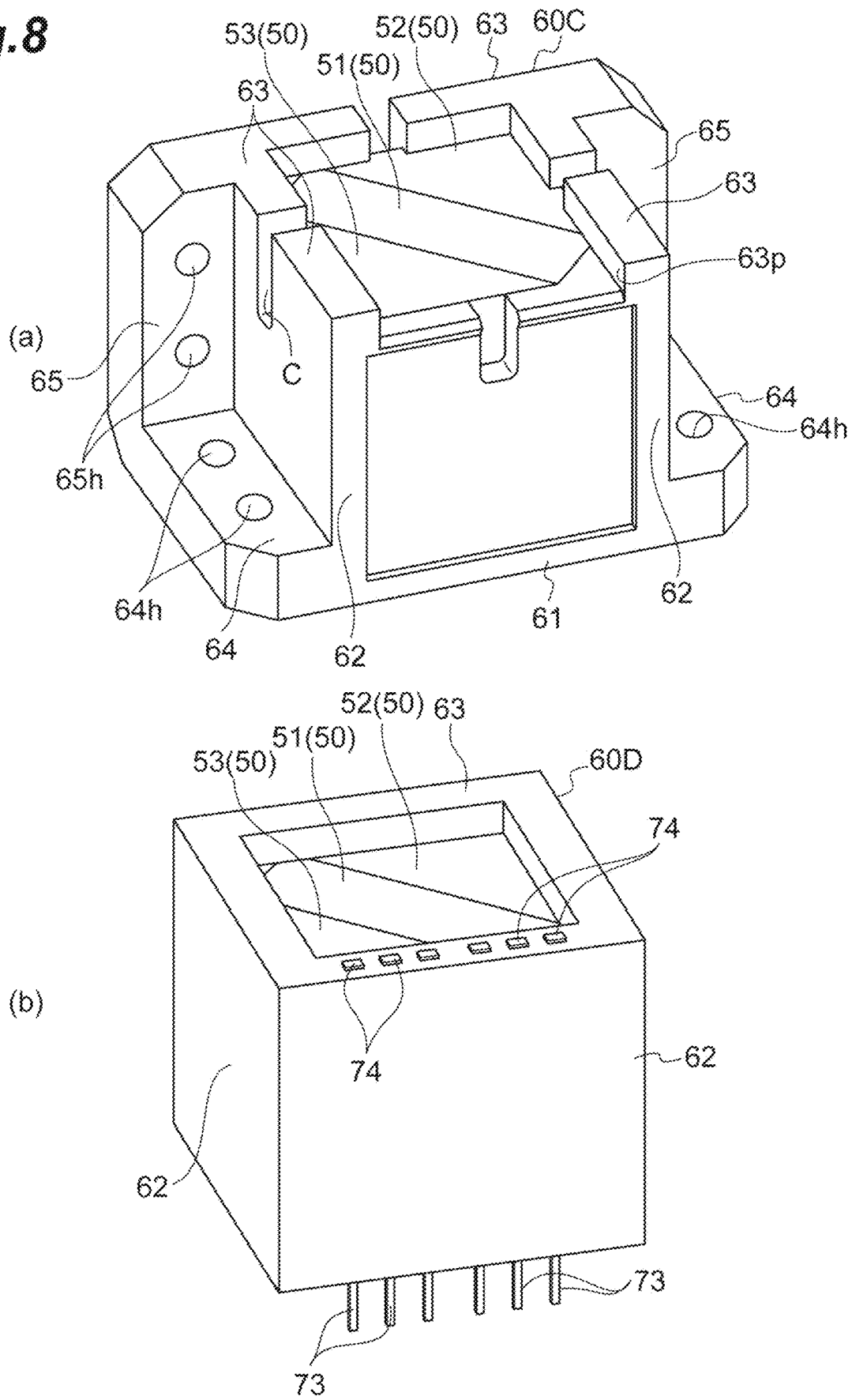
FIG. 8 is a view illustrating a package according to another modification example.

In addition, the package 60 can be modified as a package 60C as illustrated in (a) of FIG. 8. The package 60C further includes a first flange portion 64 having a plate shape projected outward from the bottom wall portion 61, and a second flange portion 65 having a plate shape projected outward from the side wall portion 62. A plurality of through-holes 64h are formed in the first flange portion 64, and a plurality of through-holes 65h are formed in the second flange portion 65. In this case, the optical module 100 is easily attached to a different device utilizing the through-holes 64h and 65h.

In addition, the package 60 can be modified as a package 60D as illustrated in (b) of FIG. 8. The package 60D has the same constitution of the restriction portion 63 as the package 60B described above and has a constitution in which a plurality of wiring portions 73 are embedded in the side wall portion 62. The wiring portion 73 is exposed on a top surface of the restriction portion 63 and serves as a pad 74.

Figure 9:
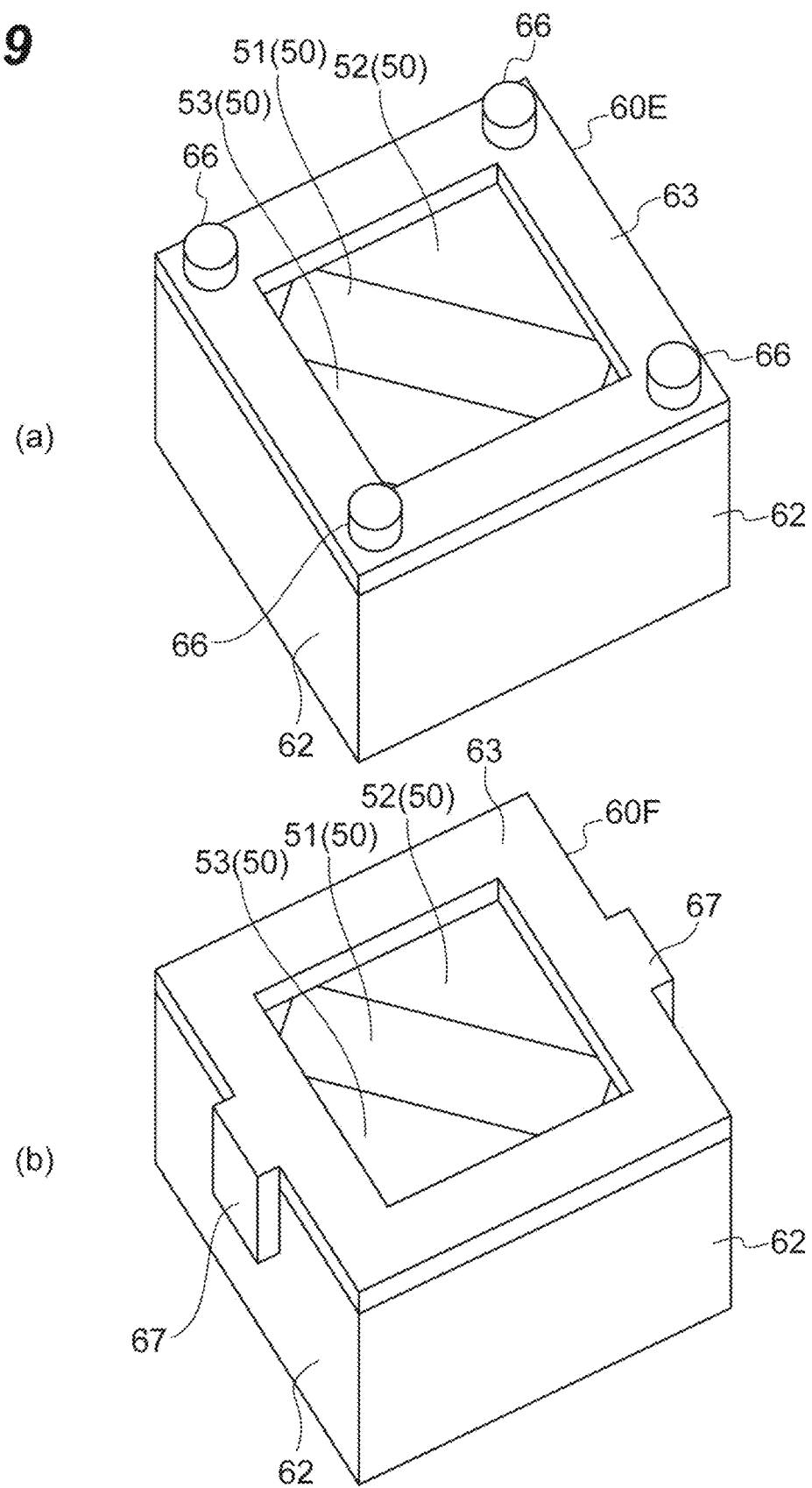
FIG. 9 is a view illustrating a package according to another modification example.

Moreover, the package 60 can be modified as a package 60E or 60F as illustrated in FIG. 9. Each of the packages 60E and 60F is not molded integrally. A unit including the bottom wall portion 61 and the side wall portion 62, and the restriction portion 63 are constituted as separate bodies. In the package 60E, the restriction portion 63 having a rectangular ring shape is fastened to the side wall portion 62 using a fastening member 66 such as a screw. In the package 60F, when an engaging claw 67 provided on the rectangular ring-shaped restriction portion 63 is engaged with the side wall portion 62, the restriction portion 63 is fixed to the side wall portion 62.

In the packages 60 to 60F described above, the restriction portion 63 may cover a portion of each of the side parts (for example, the first side part 52p, the second side part 52r, the third side part 53p, and the fourth side part 53r) of the upper surface 50a. That is, the restriction portion 63 may cover at least a portion of the upper surface 50a. Moreover, the restriction portion 63 may cover at least a portion of each side parts of the upper surface 50a.

On the other hand, the bottom wall portion 61 of each of the packages 60 to 60F may support only the area 51b of the area 51b of the first magnet 51. Moreover, the bottom wall portion 61 may support only a portion of the area 51b. That is, the bottom wall portion 61 may support at least a portion of the area 51b. In addition, the side wall portion 62 of each of the packages 60 to 60F may support at least a portion of the side surface 50s of the magnet portion 50.

In the foregoing embodiment, a case where the mirror unit 40 is bonded directly to the upper surface 50a of the magnet portion 50 using the adhesive resin R has been described. However, another layer may be interposed between the mirror unit 40 and the upper surface 50a. For example, the package 60 may include a covering portion covering the entire upper surface 50a, and the mirror unit 40 may be disposed on the upper surface 50a and the covering portion.

In addition, a constitution of the magnet portion 50 is not limited to the foregoing constitution. The magnet portion 50 may include four or more magnets or may be constituted of two magnets. Moreover, the magnets may be bonded to each other using an adhesive resin in a state where mechanical separation is curbed by the package 60.

In addition, in FIGS. 1 and 3, the window member 44 of the optical module 100 is inclined such that it approaches the base 42 progressively toward the second magnet 53 from the second magnet 52. However, an inclination direction of the window member 44 is not limited thereto and can be an arbitrary direction.

In addition, FIG. 1 and other diagrams illustrate the optical module 100 in a state where the bottom wall portion 61 of the package 60 is positioned below the side wall portion 62. However, the optical module 100 can be used with the side wall portion 62 positioned below. That is, in the foregoing embodiment, the terms "bottom wall portion," and "side wall portion" do not limit the posture of the optical module 100 with respect to the vertical direction.

In addition, in the foregoing embodiment, the movable mirror portion 10 of the MEMS mirror 1 has been described as an example of a movable mirror portion, but this example does not limit the size of the movable mirror portion.

Moreover, the movable mirror portion is not limited to the constitution of the movable mirror portion 10 in the foregoing embodiment. Any movable constitution may be adopted arbitrarily, such as a single or dual axis, a one-side support or a both-side support using a torsion bar, or the like.

INDUSTRIAL APPLICABILITY

An optical module and a method for manufacturing the optical module capable of improving the reliability and reducing costs can be provided.

REFERENCE SIGNS LIST

3 First movable portion (movable portion)
4 Second movable portion (movable portion)
10 Movable mirror portion
11 First drive coil (coil)
12 Second drive coil (coil)
40 Mirror unit
50 Magnet portion
50a Upper surface
50b Bottom surface
50s Side surface
51 First magnet
51b Area (first area)
52, 53 Second magnet
52a, 53a Area (second area)
52p First side part
52r Second side part
53p Third side part
53r Fourth side part
60 Package
61 Bottom wall portion
62 Side wall portion
63 Restriction portion
SP Space
G Gap
D1 First direction
D2 Second direction

The invention claimed is:

1. An optical module comprising:
 a mirror unit having a movable mirror portion including a coil;
 a magnet portion having an upper surface, a bottom surface, and a side surface extending from the upper surface to the bottom surface, and configured to generate a magnetic field acting on the movable mirror portion; and
 a package accommodating the magnet portion,
 wherein the magnet portion has a Halbach structure including a first magnet including a first area on the bottom surface and applied with a force in a first direction from the upper surface to the bottom surface, and a second magnet including a second area on the upper surface and applied with a force in a second direction from the bottom surface to the upper surface,
 wherein the package has a bottom wall portion configured to support the first area, a side wall portion supporting the side surface, and a restriction portion configured to restrict movement of the second magnet in the second direction by covering at least a portion of the second area, and
 wherein the movable mirror portion is disposed in a space formed by the upper surface and the restriction portion.

2. The optical module according to claim 1,
 wherein the magnet portion has a pair of second magnets disposed with the first magnet interposed therebetween,
 wherein one second magnet of the pair of second magnets includes a first side part and a second side part of the second area, and
 wherein the restriction portion covers at least a portion of the first side part and the second side part.

3. The optical module according to claim 2,
 wherein the other second magnet of the pair of second magnets includes a third side part and a fourth side part of the second area, and
 wherein the restriction portion covers at least a portion of the third side part and forms a leading-out portion of a wiring by exposing at least a portion of the fourth side part.

4. The optical module according to claim 1,
 wherein the restriction portion covers at least a portion of each of the two side parts of the upper surface.

5. The optical module according to claim 1,
 wherein the restriction portion covers at least a portion of each of the four side parts of the upper surface.

6. The optical module according to claim 1,
 wherein a gap is formed between the mirror unit and the restriction, portion when viewed in a direction intersecting the upper surface.

7. The optical module according to claim 1,
 wherein the bottom wall portion, the side wall portion, and the restriction portion are integrally formed.

8. The optical module according to claim 1,
 wherein the movable mirror portion has a movable portion, and
 wherein a width of the movable portion along the upper surface is smaller than a width of the first area along the upper surface.

9. A method for manufacturing an optical module comprising:
 a first step of preparing a mirror unit having a movable mirror portion including a coil, a package, and a magnet portion being accommodated in the package and having an upper surface, a bottom surface, and a side surface extending from the upper surface to the bottom surface; and
 a second step of disposing the mirror unit on the magnet portion subsequently to the first step,
 wherein the magnet portion has a Halbach structure including a first magnet including a first area on the bottom surface and applied with a force in a first direction from the upper surface to the bottom surface, and a second magnet including a second area on the upper surface and applied with a force in a second direction from the bottom surface to the upper surface, wherein the package has a bottom wall portion configured to support the first area, a side wall portion configured to support the side surface, and a restriction portion configured to restrict movement of the second magnet in the second direction by covering at least a portion of the second area, and wherein, in the second step, the movable mirror portion is disposed in a space formed by the upper surface and the restriction portion.

* * * * *